US006905944B2

United States Patent
Chudzik et al.

(10) Patent No.: US 6,905,944 B2
(45) Date of Patent: Jun. 14, 2005

(54) SACRIFICIAL COLLAR METHOD FOR IMPROVED DEEP TRENCH PROCESSING

(75) Inventors: Michael Patrick Chudzik, Beacon, NY (US); Irene McStay, Hopewell Junction, NY (US); Helmut Horst Tews, Munich (DE); Porshia Shane Wrschka, Danbury, CT (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 10/249,798

(22) Filed: May 8, 2003

(65) Prior Publication Data

US 2004/0224478 A1 Nov. 11, 2004

(51) Int. Cl.$^7$ ............................................... H01L 21/76
(52) U.S. Cl. ..................... 438/435; 438/242; 438/244; 438/245; 438/259; 438/246; 257/330; 257/331
(58) Field of Search ............................ 438/242, 244, 438/245, 259, 246, 435; 257/330, 331, 328

(56) References Cited

U.S. PATENT DOCUMENTS 6,153,474 A * 11/2000 Ho et al. ..................... 438/270

6,437,401 B1 * 8/2002 Mandelman et al. ....... 257/330

* cited by examiner

*Primary Examiner*—David Nelms
*Assistant Examiner*—Renee R. Berry
(74) *Attorney, Agent, or Firm*—Steven Capella; Daryl K. Neff

(57) ABSTRACT

A method for fabricating a deep trench etched into a semiconductor substrate is provided by the present invention. The trench is divided into an upper portion and a lower portion and the method allows for the lower portion to be processed differently from the upper portion. After the trench is etched into the semiconductor substrate, a nitride layer is formed over a sidewall of the trench. A layer of oxide is then formed over the nitride layer. A filler material is then deposited and recessed to cover the oxide layer in the lower portion of the trench, followed by the removal of the oxide layer from the upper portion of the trench above the filler material. Once the oxide layer is removed from the upper portion of the trench, the filler material can also be removed, while allowing the oxide layer and the nitride layer to remain in the lower portion of the trench. Silicon is selectively deposited on the exposed nitride layer in the upper portion of the trench. The oxide layer and the nitride layer is then removed from the lower portion. Finally, the lower portion of the trench is processed selectively to nitride, e.g. by one or more capacitor forming processes, and then the upper portion of the trench is processed.

20 Claims, 3 Drawing Sheets

SACRIFICIAL COLLAR METHOD FOR IMPROVED DEEP TRENCH PROCESSING

BACKGROUND OF INVENTION

The invention relates to a semiconductor processing method, and more particularly to an improved method for processing a deep trench structure such as used as a storage capacitor of a dynamic random access memory.

In dynamic random access memories (DRAMs), as in all integrated circuits (ICs), there are ongoing efforts to reduce the size of all components. Components are required which occupy a smaller surface area of the IC. However, the use of smaller components can impact operability. For example, in the case of storage capacitors used in each memory cell of the DRAMs, reducing size can result in reduced storage capacitance of the memory cell, which, in turn, can adversely affect the functionality, and usability of the DRAM. The ratio of the storage capacitance to the bit line capacitance is critical in determining the signal level, since a ratio that is too small may be unable to produce the desired signal. DRAMs having smaller storage capacitance also require a higher refresh frequency. Increasingly, trench capacitors and other trench insulation structures are becoming the more attractive option in highly dense environments for the aforementioned reasons.

One type of storage capacitor used in DRAMs is the trench capacitor. A trench capacitor has a three-dimensional structure and is formed by etching into the silicon substrate. An increase in the capacitance of the trench capacitor can be achieved by etching deeper into the substrate. This is partly the reason for the popularity of this type of capacitor, because an increase in the capacitance of the trench capacitor enlarging the surface area occupied by the memory cell.

Furthermore, when surface flatness is desired, trench capacitors provide a suitable solution because their use does not affect planarity of features on or above the substrate surface. Nonetheless, the ever-increasing density of such environments still requires the size (diameter) of the trench openings to be reduced and is a factor that has to be considered when implementing trench capacitors or other trench isolation structures.

In fabricating trench capacitors (or any kind of trench isolation structure) it is a challenge to perform deep substrate etching at sufficiently small diameters to achieve the required component density. In fabricating trench structures, several layers of materials must be deposited within the trench. Since the trench diameter (opening) is very small, the deposited chemical layers can constrict the trench opening to the point in which subsequent chemical layers cannot be deposited effectively, if at all.

Even if the chemical layers are to be etched away later, the clogging of the opening adds difficulty to etching process and complexity to subsequent processes, and can ultimately impact device operability. In addition, once the trench opening is blocked or even when only a narrow opening remains, subsequent fabrication processes can become complicated and cost prohibitive.

Keeping trench diameters uniform across the substrate during fabrication runs is another challenge. Uniformity of trench diameter is desired to maintain sufficient storage capacitance in each memory cell. An improved fabrication method is sought for processing deep trenches in forming trench capacitors in such challenging environments. The present invention provides such an improved method.

SUMMARY OF INVENTION

The present invention provides for a method for processing a deep trench etched into a semiconductor substrate to define an upper portion and a lower portion of the trench to allow the lower portion to be processed differently from the upper portion, e.g. for forming a trench capacitor. After the trench is etched into the semiconductor substrate, a nitride layer is formed over a sidewall of the trench. In an alternate embodiment, an underlying oxide layer is formed over the trench sidewall prior to forming the nitride layer. An outer layer of oxide is then formed over the nitride layer. A filler material is deposited in the trench and then recessed to cover the oxide layer in only the lower portion of the trench, and then the outer oxide layer is removed from the upper portion of the trench. Once the oxide layer is removed from the upper portion of the trench, leaving the nitride layer exposed there, the filler material can then be removed. Silicon, preferably amorphous silicon, is then selectively deposited to form a layer on the exposed nitride layer in the upper portion of the trench. With the deposited silicon layer protecting the upper portion of the trench, the oxide layer and the nitride layer are then removed from the lower portion of the trench. Thereafter, the lower portion of the trench is processed selectively to nitride, for example, to form a bottle shape, buried plate, and node dielectric of a trench capacitor. The upper portion of the trench is then processed, for example, to form an isolation collar.

DETAILED DESCRIPTION

FIGS. 1 through 5 illustrate an embodiment of a method of processing a trench in a semiconductor substrate, e.g. a deep trench, in a way that reduces fabrication and non-uniformity problems associated with the formation of such trench structures. A sacrificial collar scheme is provided in the embodiment, which addresses concerns related to both maintaining the size of the trench opening during processing, as well as maintaining sufficient trench uniformity within the integrated circuit. The "collar" formed as a result of the method is referred to as sacrificial because the deposited layer which make it up are used to separate the upper portion from and lower portion of the trench. In the ordinary course of fabrication, it is expected that the upper portion of the trench requires removing the sacrificial collar and subsequent processing to form the actual isolation collar in the trench.

Figure 1:
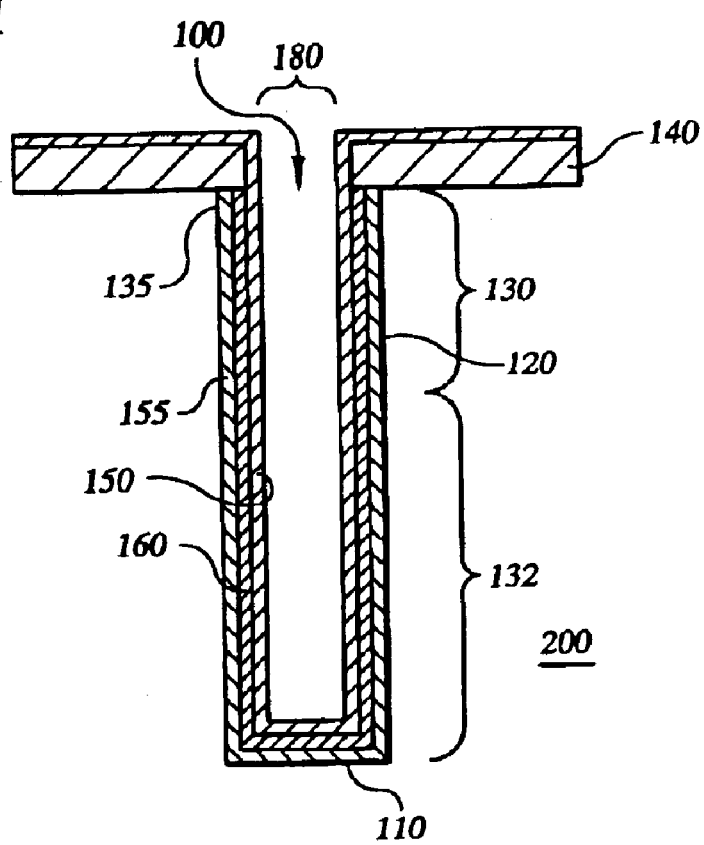
FIG. 1 illustrates a stage in processing as per an embodiment of the processing method in which a deep trench structure is shown, after oxide and nitride layers have been applied.

FIG. 1 is an illustration of deep trench (DT) as shown at (100). The deep trench in FIG. 1 is etched into the semiconductor substrate using conventional methods such as known to those skilled in the art. Such techniques may include but are not limited to etching techniques, where a hard mask layer is patterned using customary photolithographic techniques in order to define the region in which a trench is to be formed. The deposition of a photoresist layer is followed by the selective exposure of the same with the desired pattern. The photoresist is subsequently developed and either the exposed or non-exposed regions are removed (positive or negative resist) and are later etched to form the deep trench.

There are different types of trench structures used in DRAMs. One kind of trench structure is used as a capacitor such as the one shown in FIG. 1. A DRAM includes an array of memory cells extending over an area of the substrate. The memory cells are connected in the form of rows and columns, with the row connections referred to as word lines and the column connections forming the bit lines. Reading data or writing data into a particular memory cell is realized by activating an appropriate combination of a word line and a bit line. A DRAM memory cell design requires a transistor and a capacitor electrically connected to one another.

In a trench capacitor structure used in DRAMs, the capacitor is formed in the substrate itself (200). The substrate is usually slightly doped (usually with p-type dopants) and the trench is usually filled with polysilicon doped with the opposite type of dopants (n-type dopants when the substrate is doped p-type ). In some structures, a buried plate that is doped n-type is placed in the substrate at a lower region of the trench. In general, the dopants are diffused into the silicon substrate from a dopant source, which is formed on the sidewalls of the trench. The polysilicon and the buried plate serve as electrodes for the capacitor, with a dielectric layer separating them.

Trench capacitors generally also include an insulating collar formed on an upper section or upper region of the trench. The purpose of the insulating collar is to help reduce leakage current, through the memory cell transistor and by parasitic conduction along the trench sidewall. The transistor has two diffusion regions, referred to as a source and a drain, separated by a channel above which a gate is arranged. The direction of the current flow will determine which diffusion region constitutes the drain as opposed to the other region which will constitute the source. One of these diffusion regions is then connected to a bit line while the other diffusion region is connected to the capacitor, with one gate being connected to a word line. Applying a voltage to the gate switches the transistor on, enabling the current to flow between the diffusion regions through the channel in order to form a connection between the capacitor and the bit line. Switching the transistor off creates a disconnection and interrupts the current flow. The charge stored in the capacitor then decreases with time on account of an inherent leakage current. Therefore, the storage capacitor must be refreshed after a certain time period. Consequently, an insulating collar is desirable because it helps reduce leakage current, thereby helping to increase the charge holding time (retention time) of the memory cell.

A second type of trench structure is provided in a DRAM in order to insulate a respective memory cell having a trench capacitor from adjacent cells. This type of trench structure is referred to as an isolation trench (IT), or simply, a trench isolation. Like a deep trench capacitor structure, it is formed by etching into the semiconductor substrate. While many different structures exist for such isolations, the distinguishing feature is its function for isolating nearby conducting elements. Whether fabricating a trench isolation or a trench capacitor structure, the fabrication challenges remain similar in nature and may be resolved in similar ways. In some instances, however, and particularly when a collar is used, the fabrication challenges for manufacturing a trench capacitor structure are intensified. This is because in the formation of such structures at very small groundrules when collars are present, several additional chemical layers have to be deposited on the sidewall of the trench, resulting in completely blocked or at best, very narrow trench openings. In such situations when the trench opening is compromised and only a small channel remains open, at best the fabrication complications are greater and difficulties associated with implementation of subsequent processing steps can impact overall functionality of the device. Therefore, for illustrative purposes and because the challenges for trench capacitor structures having isolation collars are greater, the embodiments herein are described in association with the formation of trench capacitors, even though the workings of the present invention can be applied to the manufacturing of any trench structure.

The deep trench shown at (100) in FIG. 1, is etched into the semiconductor substrate. The deep trench (100) comprises a bottom, as shown at (110) and sidewalls, as shown at (120). An area of the deep trench is further designated as the upper portion, as shown at (130). A region of the deep trench below the upper portion (130) is designated as a lower portion (132). A pad nitride, as shown at (140), is provided over the upper edge/lip of the sidewalls (135), as shown. In an embodiment of the invention, an oxide layer (155), referred to as an underlying oxide layer, is deposited in the trench (100) prior to forming subsequent layers. However, this underlying oxide layer (155) is optional, as an embodiment of the method can be practiced without it. The oxide layer (155), when present, is deposited in a manner so as to coat the sidewalls and the bottom of the deep trench. The thickness of this underlying oxide layer can vary but is kept sufficiently thin, preferably of thickness between about 20 Å and 60 Å, with 40 Å being the most preferred.

A layer of nitride, as shown at (160), is then deposited thereover, including over the underlying oxide layer (155), when present. The deposition of this layer of nitride can be accomplished in a variety of ways such as LPCVD (low pressure chemical vapor deposition) or other similar methods known to those skilled in the art. Again, the thickness of this nitride layer must be kept sufficiently thin without it becoming so thin as to affect functionality. The thickness is preferred between about 40 Å and 100 Å, with a target value of 60 Å.

After the nitride layer is deposited, an outer layer of oxide, as shown at (150), is then deposited over the nitride layer (160). This outer layer of oxide can be provided in a number of ways, some ways being the oxidation of a small thickness of the already deposited nitride layer, or by deposition, through conventional means as known to those skilled in the art. In either case, as shown in FIG. 1, this outer oxide layer (150) must cover sidewalls in both the upper portion (130) and lower portion (132) of the trench, as well as the pad nitride (140). All layers are deposited with great attention to their thicknesses, to allow the trench opening (180) to remain sufficiently wide, while assuring the layers have sufficient thicknesses to permit subsequent etch processes to be performed with the layers removed from the lower portion (132) of the trench, while the layers remain in place to protect the upper portion of the trench from such etch processes.

A filler material (210), preferably of polysilicon, is then deposited to fill the trench. In addition to polysilicon, amorphous silicon can also be used as the filler material (210), as well as other materials that can be removed selectively to nitride and oxide, such as various photoresist materials known in the art. The filler material is then recessed to remove it from the upper portion of the trench but is left in the lower portion of the trench, as shown in FIG. 2.

Figure 2:
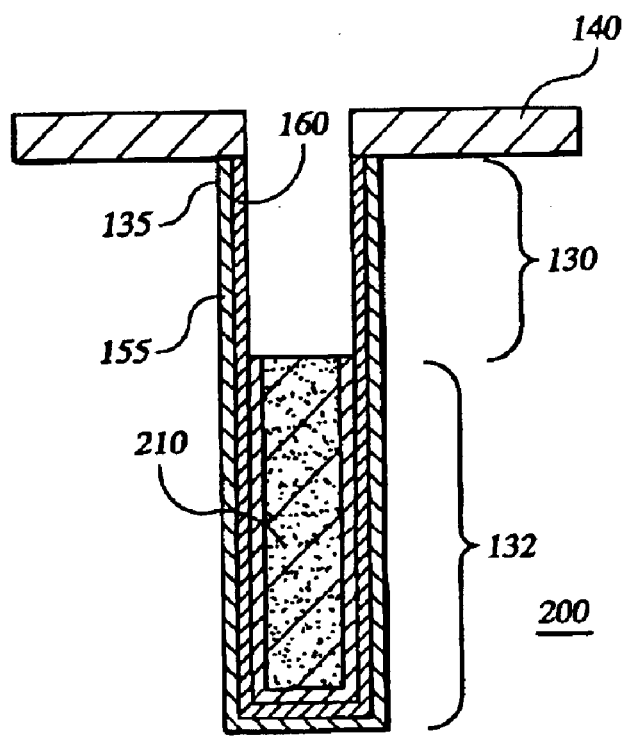
FIG. 2 illustrates a subsequent stage in processing, in which some of the oxide coating is removed from the trench sidewalls to expose the nitride layer.

In alternative embodiments, the removal of the filler material layer may be performed so that the filler material is recessed to a higher or lower point in the trench than that which is illustrated in the embodiment of FIG. 2. Furthermore, a variety of methods can also be utilized for such removal, such as chemical dry etching (CDE), reactive ion etching (RIE), or other conventional methods known to those skilled in the art. Multi-step removal procedures may also be used, if desired, but when fabrication cost or time is of the essence, single step removal procedures may be preferable.

Once the filler material (210) has been recessed, the outer layer of oxide is then removed by etching from the upper portion (130) of the trench to expose the underlying nitride layer, as shown in FIG. 2. In the process, the outer oxide layer (150) is also removed from the nitride pad (140). The removal of the outer oxide layer can be accomplished in a variety of ways, such as those described above, or any of many other known ways of etching oxides. It should be noted that the outer oxide layer can be easily removed from the areas not covered by the filler material but remains in the lower portion (132) of the trench where covered by the filler material, because the filler material protects the oxide and nitride layer stack in the lower portion of the trench. Etching or other techniques used to remove the outer oxide layer from the upper portion of the trench then does not affect the oxide/nitride stack in the lower portion. The removal of the filler material and the outer oxide layer exposes the surface of the nitride layer (160) along sidewalls in the upper portion (130) of the trench. The lower portion (132) (along the sidewalls and the bottom) of the trench, however, remains covered by the outer oxide layer.

Figure 3:
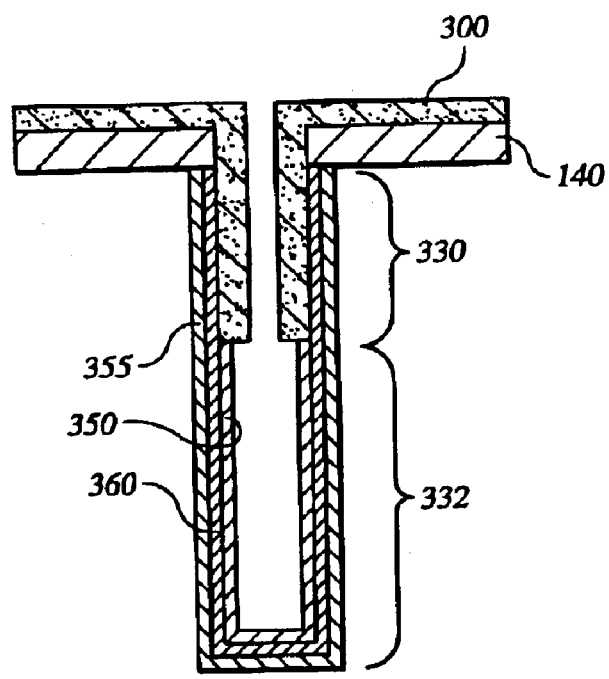
FIG. 3 illustrates a stage in processing subsequent to the stage shown in FIG. 2 in which polycrystalline or amorphous silicon (Si) has been selectively deposited selectively on the exposed nitride layer in the upper portion of the trench.

Once the outer oxide layer is removed, the filler material can also be removed as per one embodiment of the present invention, as shown in FIG. 3. As per one embodiment of the present invention, the removal of the filler material can then be followed by post cleanup procedures as known to those skilled in the art.

It is known to those skilled in the art that materials such as amorphous or polycrystalline silicon can be deposited selectively on nitride surfaces, while not deposited on oxide, as used in the embodiment described herein as follows. FIG. 3 illustrates the selective deposition of polysilicon or amorphous silicon (Si) (300) in the upper portion (330) of the trench where the nitride layer (360) is exposed.

The deposited silicon (Si) 300, is shown in FIG. 3 covering the prior layer(s) in the upper portion of the trench, as well as the pad nitride (140). An oxide etch, selective to the material of the deposited silicon, whether amorphous silicon or polysilicon, is then performed in the lower portion (332) of the trench, where the outer oxide layer (350) is exposed.

After the outer oxide layer (350) is removed and the nitride layer (360) underneath this second layer becomes exposed, a nitride etch selective to the deposited silicon (amorphous or polycrystalline Si) is also performed. This procedure removes the nitride layer (360) and exposes the optional underlying oxide layer (355), if present, in areas indicated at (332) in FIG. 3. After this procedure is conducted, if the optional underlying oxide layer is present, a second oxide etch selective to the deposited silicon is performed to remove that oxide layer from the lower portion of the trench, preferably leaving the sidewalls in the lower portion (410) of the trench now exposed for subsequent processing of the silicon in the lower portion, as illustrated in FIG. 4.

Figure 4:
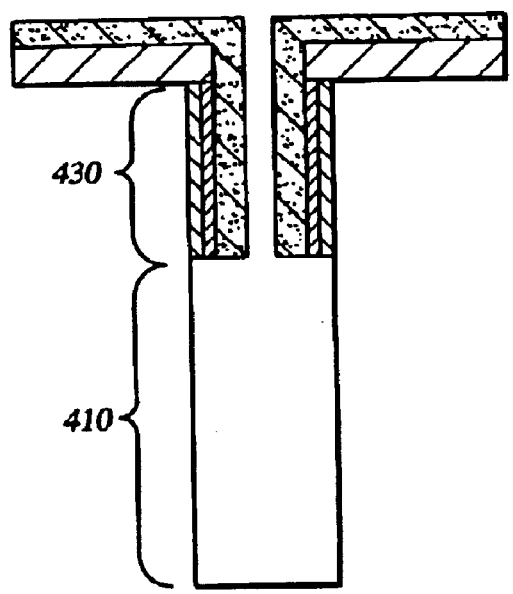
FIG. 4 illustrates a stage in processing subsequent to the stage shown in FIG. 3, in which the oxide and nitride layers are removed from the lower portion of the trench.

As shown in FIG. 4, the single crystal silicon in the lower portion (410) of the trench is preferably now exposed in both the bottom of the trench as well the sidewalls, while sidewalls in the upper portion of the trench (430) retain the nitride layer and optional underlying oxide layer.

Figure 5:
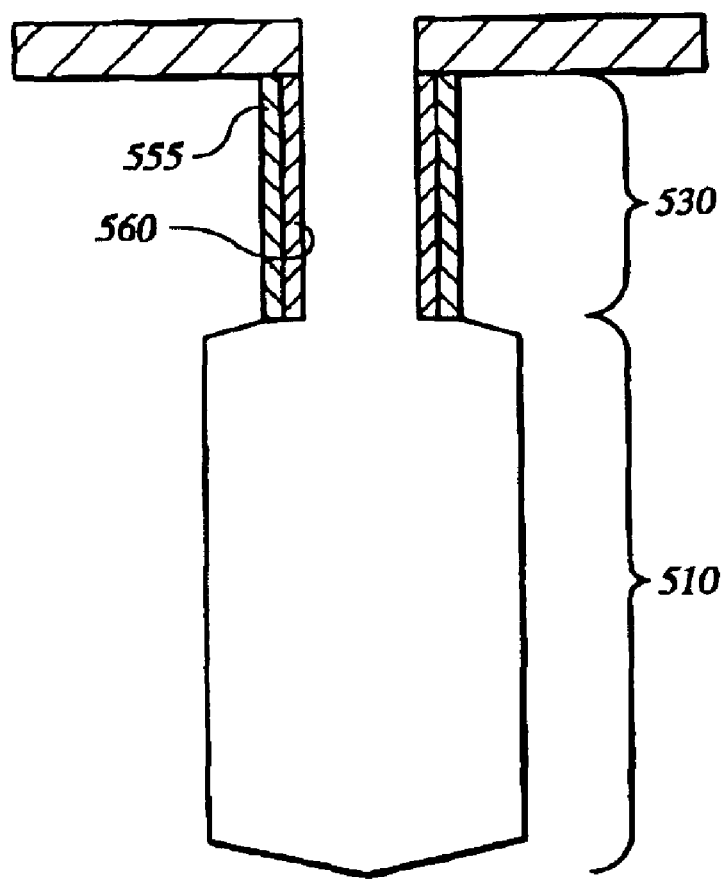
FIG. 5 illustrates a stage in processing subsequent to the stage shown in FIG. 4, in which the lower portion of the trench is enlarged by processing, e.g. isotropic etching selective to nitride, to a greater diameter than the upper portion of the trench.

In FIG. 5, the amorphous or polycrystalline layer is removed from the upper portion (530) of the trench. The process has now produced a relatively thin sacrificial collar layer, formed by the nitride layer (560) and the optional underlying oxide layer (555) in the upper portion (530) of the trench. The sacrificial collar, thus formed, now allows the lower portion (510) of the trench to be processed separately from the upper portion (530) of the trench, in ways that are more tolerant of variations in the trench diameter, because the sacrificial collar is thin compared to an actual isolation collar which performed this function before. It should be noted that in another embodiment of the present invention, a similar process can be used in which the underlying oxide layer (555) is not deposited, such that only a nitride layer (560) is left in the area shown at (530) in FIG. 5 instead of the oxide/nitride stack of the embodiment shown in FIG. 5.

The lower portion of the trench is then subjected to one or more capacitor forming processes such as trench bottling processing, buried plate processing, and node dielectric processing. For example, in the embodiment shown in FIG. 5, the lower portion of the trench is enlarged in a trench "bottling" process, e.g. by isotropic silicon etching, to increase the diameter of the lower portion (510) to greater than that of the upper portion (530). Such an increase in diameter is performed to increase the capacitance of the storage capacitor to be formed in the trench. The final trench capacitor, whether it is to have a "bottle" structure or any other structure, can be achieved through a variety of processes known to those skilled in the art.

The sacrificial collar formed in the upper portion of the trench has now improved the process window to allow for one or more processes to be performed, selectively to the nitride of the sacrificial collar, which are specific to the lower portion of the trench. In such way, the concerns of the described background are relieved because the sacrificial collar is formed sufficiently thin to leave more room for chemicals to pass through the trench opening, and is less likely to close up during processing.

Once the desired processes are performed in the lower portion of the trench, the remaining nitride layer (560) and the underlying oxide layer (555), if present, are removed from the upper portion (530) of the trench. The upper portion of the trench is then processed, e.g. by processes specific thereto, to form structures in the upper portion such as the final isolation collar, buried strap, and vertical transistor, if desired.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of defining an upper portion and a lower portion of a trench etched into a semiconductor substrate to permit said lower portion to be processed differently from said upper portion, comprising:

etching a trench into a semiconductor substrate;

forming a nitride layer over a sidewall of said trench;

forming an oxide layer over said nitride layer;

depositing and recessing a filler material to cover said oxide layer in a lower portion of said trench;

removing said oxide layer to expose said nitride layer in an upper portion of said trench above said filler material;

removing said filler material from said trench while leaving said oxide layer and said nitride layer in said lower portion of said trench;

depositing silicon selectively on said exposed nitride layer in said upper portion of said trench;

removing said oxide layer and said nitride layer from said lower portion of said trench;

processing said lower portion of said trench selectively to nitride; and subsequently processing said upper portion of said trench.

2. The method of claim 1 wherein an underlayer of oxide is formed on a sidewall of said trench before said nitride layer is formed thereover.

3. The method of claim 1 wherein said upper portion is subsequently processed to form an isolation collar.

4. The method of claim 1 wherein said lower portion is processed by isotropic etching to form a bottle-shaped trench.

5. The method of claim 1 wherein said filler material comprises photoresist.

6. The method of claim 1 wherein said filler material comprises polysilicon.

7. The method of claim 1 wherein said deposited silicon comprises amorphous silicon.

8. The method of claim 1 wherein said deposited silicon comprises polysilicon.

9. The method of claim 1 wherein said nitride layer ranges in thickness from about 40 Å to 100 Å.

10. The method of claim 1 wherein said nitride layer is about 60Å.

11. The method of claim 2 wherein said underlayer of oxide ranges in thickness from about 20 Å to 60 Å.

12. The method of claim 2 wherein said underlayer of oxide is about 40 Å.

13. The method of claim 1 wherein said oxide layer is formed by oxidation of said nitride layer.

14. The method of claim 1 wherein said oxide layer is formed by deposition.

15. A method of defining an upper portion and a lower portion of a trench etched into a semiconductor substrate to process said lower portion differently from said upper portion, comprising:

etching a trench into a semiconductor substrate;

forming a first oxide layer on a sidewall of said trench;

forming a nitride layer over said first oxide layer;

forming a second oxide layer over said nitride layer;

depositing and recessing a filler material to cover said second oxide layer in a lower portion of said trench;

removing said second oxide layer to expose said nitride layer in an upper portion of said trench above said filler material;

removing said filler material from said trench while allowing said first and said second oxide layers and said nitride layer to remain in said lower portion of said trench;

depositing silicon selectively on said exposed nitride layer in said upper portion of said trench;

removing said first and said second oxide layers and said nitride layer from said lower portion of said trench;

processing said lower portion of said trench selectively to nitride to form a storage capacitor portion of said trench; and subsequently processing said upper portion of said trench to form an isolation collar therein.

16. The method of claim 15 wherein said deposited silicon comprises amorphous silicon.

17. The method of claim 15 wherein said deposited silicon comprises polysilicon.

18. The method of claim 15 wherein said second oxide layer is formed by oxidation of said nitride layer.

19. The method of claim 15 wherein said lower portion is processed by isotropic etching to form a bottle shape prior to removing said nitride layer and said first oxide layer from said upper portion of said trench.

20. The method of claim 19 wherein said isolation collar is formed in said upper portion of said trench after removing said nitride layer and said first oxide layer therefrom.

* * * * *